United States Patent
Ueda et al.

(10) Patent No.: US 7,664,151 B2
(45) Date of Patent: Feb. 16, 2010

(54) NITRIDE SEMICONDUCTOR LASER DIODE

(75) Inventors: Tetsuzo Ueda, Osaka (JP); Daisuke Ueda, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/979,877

(22) Filed: Nov. 9, 2007

(65) Prior Publication Data
US 2008/0112448 A1 May 15, 2008

(30) Foreign Application Priority Data
Nov. 9, 2006 (JP) ............................ 2006-304139

(51) Int. Cl.
*H01S 5/00* (2006.01)
(52) U.S. Cl. .............................. 372/44.011; 372/45.012
(58) Field of Classification Search ............. 372/43.01, 372/45.012, 49.01, 75; 257/628
See application file for complete search history.

(56) References Cited

U.S. PATENT DOCUMENTS

| | | | | |
|---|---|---|---|---|
| 5,247,533 | A * | 9/1993 | Okazaki et al. .......... | 372/45.01 |
| 5,583,879 | A * | 12/1996 | Yamazaki et al. ........ | 372/45.01 |
| 5,585,648 | A * | 12/1996 | Tischler .................. | 257/77 |
| 5,604,763 | A * | 2/1997 | Kato et al. ............... | 372/45.01 |
| 5,843,227 | A * | 12/1998 | Kimura et al. ............ | 117/101 |
| 5,864,171 | A * | 1/1999 | Yamamoto et al. .......... | 257/628 |
| 6,080,599 | A * | 6/2000 | Yamamoto et al. ........... | 438/33 |
| 6,680,959 | B2 * | 1/2004 | Tanabe et al. ............ | 372/45.01 |
| 2005/0117085 | A1 * | 6/2005 | Taira et al. .................... | 349/56 |

FOREIGN PATENT DOCUMENTS

JP 2004-031657 1/2004

OTHER PUBLICATIONS

Nakamura, et al., "High-Power, Long-Lifetime InGaN/GaN/AlGaN-Based Laser Diodes Grown on Pure GaN Substrates," Japanese Journal of Applied Physics, vol. 37, pp. L309-L312, 1998.
Egawa, et al., "High Performance of InGaN LEDs on (111) Silicon Substrates Grown by MOCVD," IEEE Electron Device Letters, vol. 26, No. 3, Mar. 2005.
Hikita, M., et al., "AlGaN/GaN Power HFET on Silicon Substrate With Source-Via Grounding (SVG) Structure", IEEE Transactions On Electron Devices, Sep. 2005, pp. 1963-1968, vol. 52 No. 9, IEEE.

* cited by examiner

*Primary Examiner*—Minsun Harvey
*Assistant Examiner*—Tuan N. Nguyen
(74) *Attorney, Agent, or Firm*—McDermott Will & Emery LLP

(57) ABSTRACT

A nitride semiconductor laser diode includes: a substrate made of silicon in which a plane orientation of a principal surface is a {100} plane; and a semiconductor that includes a plurality of semiconductor layers formed on the substrate and including an active layer, each of the plurality of semiconductor layers being made of group III nitride. The semiconductor has a plane parallel to a {011} plane which is a plane orientation of silicon as a cleaved facet, the cleaved facet forming a facet mirror.

17 Claims, 6 Drawing Sheets

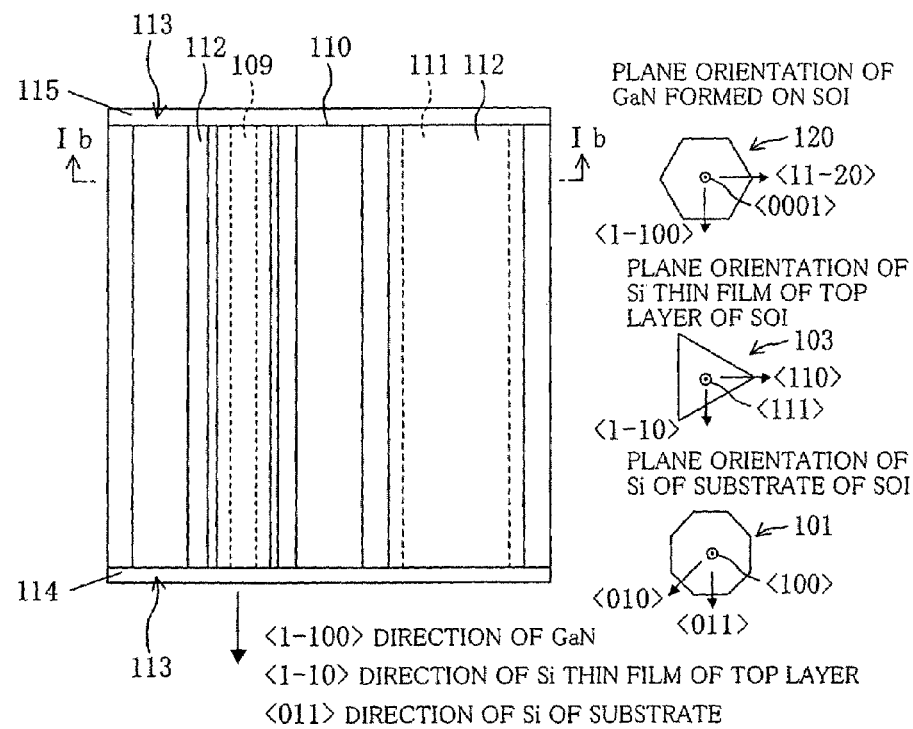
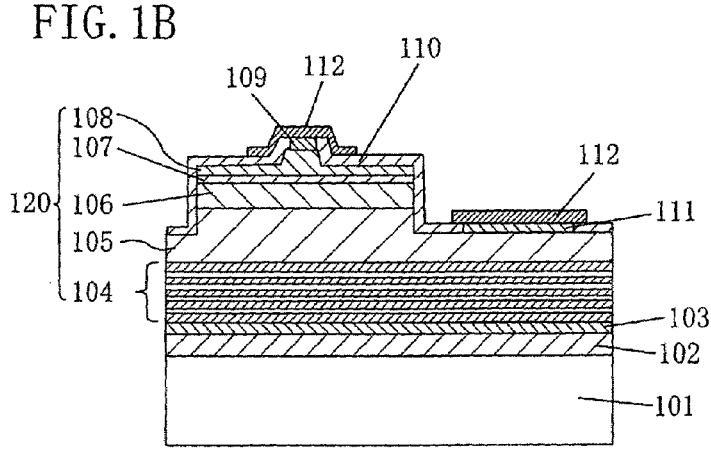

FIG. 4A
FIG. 4C
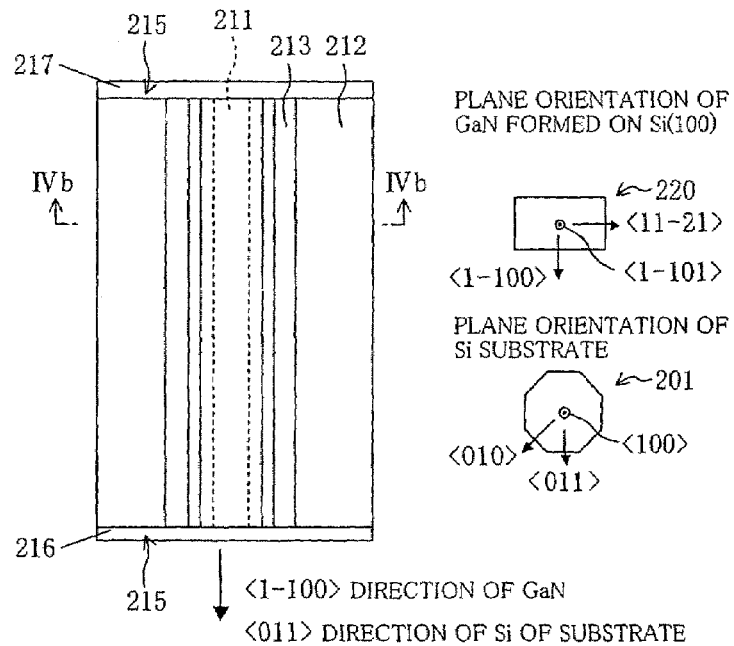
PLANE ORIENTATION OF GaN FORMED ON Si(100)
PLANE ORIENTATION OF Si SUBSTRATE
⟨1-100⟩ DIRECTION OF GaN
⟨011⟩ DIRECTION OF Si OF SUBSTRATE
FIG. 4B
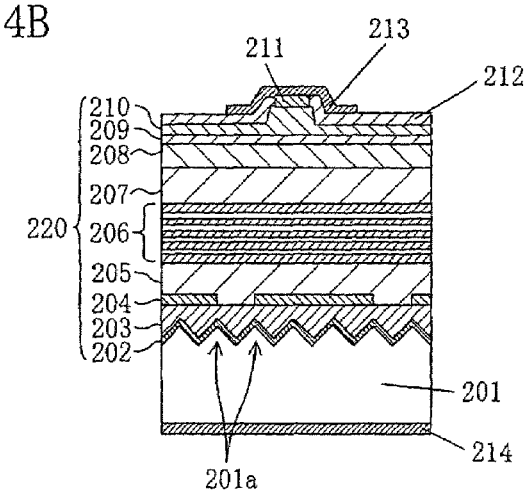

10 μm

NITRIDE SEMICONDUCTOR LASER DIODE

CROSS REFERENCE TO RELATED APPLICATIONS

This non-provisional application claims priority under 35 U.S.C. §119(a) on Patent Application No. 2006-304139 filed in Japan on Nov. 9, 2006, the entire contents of which are hereby incorporated by reference.

BACKGROUND OF THE INVENTION

1. Field of the Invention

The present invention relates to a nitride semiconductor laser device applicable to a blue-violet semiconductor laser device used for a light source for writing and reading a high-density optical disk.

2. Description of Related Art

A group III-V nitride compound semiconductor (generally expressed by InGaAlN) typified by gallium nitride (GaN) is a material having a wide bandgap (in the case of GaN, 3.4 eV at room temperature) and capable of realizing an optoelectronic devices emitting the wavelength ranging from green to ultra-violet. Blue/green light emitting diodes have been commercialized and widely used in various displays and indicators. Moreover, a white light emitting diode in which a blue or an ultraviolet light emitting diode excites a fluorescent material has been also commercialized and has been used as a backlight of a liquid crystal display, for example.

An additional new application field of a nitride compound semiconductor is a blue-violet laser diode to be used as a light source for a next-generation high-density optical disk. Through the progress of research and development on the epitaxial growth and the processing technology, the blue-violet laser device using the nitride compound semiconductor has reached to a level satisfying the specification of a next-generation optical disk typified by Blu-ray or HD-DVD. Most of the commonly available GaN-based blue-violet semiconductor laser diodes use GaN substrates for the epitaxial growth (see, for example, S. Nakamura et al., Jpn. J. Appl. Phys., Vol. 37 (1998) L309). This is because a substrate having less crystal defects is desired to improve reliability and because an excellent cleavage face is desired to secure a sufficiently high mirror reflectivity to thus achieve a low operating current.

However, a currently available GaN substrate is manufactured by thick film growth by a hydride vapor phase epitaxy (HVPE) method instead of a conventional bulk growth forming a boule, so that there is a limitation to increase in the throughput and wafer size keeping good crystal quality. For this reason, the cost of the substrate tends to be high and hence there would be a limitation to reduction in cost of the GaN-based semiconductor laser diode. Thus, to put a next-generation optical disk system using the GaN-based semiconductor laser device into widespread use, reduction in cost of the laser diode is strongly desired.

Recently, epitaxial growth of GaN on a silicon (Si) substrate has received much attention as a solution for manufacturing a GaN-based device at a lower cost. So far, the crystal quality of the GaN-based semiconductor has been greatly improved by a unique buffer layer structure or the like and, for example, a bright blue light emitting diode on a Si substrate has been reported (see, for example, T. Egawa et al., IEEE Electron Device Lett., Vol. 26 (2005), p. 169). If the laser structure is grown on a large area Si substrate at a low cost, the cost of a blue-violet semiconductor laser diode would be greatly reduced.

Moreover, a nitride semiconductor light emitting device on a Si substrate is disclosed, in which grooves with a V-shaped cross section are formed in the principal surface of the Si substrate having a plane at an off-angle of 7.3 degrees with respect to the (100) plane and GaN epitaxially grown on the Si substrate has a principal surface of a (1-101) plane. (see, for example, Japanese Patent Unexamined Publication No. 2004-031657, hereinafter referred to it as Patent Document 1).

However, most of the epitaxial growth of the GaN-based semiconductor on the Si substrate in the related art has been entirely performed on the Si substrate with a principal surface of a (111) plane. In the case where this growth technology is applied to a blue-violet semiconductor laser diode, a cleavage facet of the GaN-based laser structure is a plane crystallographically equivalent to the (110) plane (for example, a plane equivalent to the (110) plane is hereinafter expressed by a {110} plane). The (110) plane of Si being is not perpendicular to both a (111) plane of the principal surface of the Si substrate and a (0001) plane of a principal surface of GaN or the like grown on the (111) plane. Thus, there arises a problem that a cleavage face perpendicular to the principal surface of a laser structure on a Si(111) cannot be obtained.

Furthermore, as described in Patent Document 1, in the case where a GaN-based semiconductor is grown on a Si substrate with the principal surface of nearly a (100) plane, the Si substrate can be cleaved at a plane equivalent to a (110) plane, but the waveguide of the laser structure described in Patent Document 1 is presumed to have a <11-20> direction. For this reason, the cleavage facet of the laser structure in this case is a (11-20) plane. Thus, when considering the relationship of a crystal orientation between the Si substrate and the GaN-based semiconductor epitaxially grown on the Si substrate, the cleavage facet of the laser structure in Patent Document 1 does not match with the one of the Si substrate, so a good cleavage facet cannot be obtained. In addition, the description related to the cleavage facet of a GaN-based laser structure on a Si substrate is not provided in Patent Document 1.

Hence, in the case where a GaN-based semiconductor laser structure is epitaxially grown on a Si (111) substrate or an off-axis Si (100) substrate with V-shaped grooves, a sufficiently high reflectivity cannot be maintained by a cleaved facet of the epitaxial structure. As a result, it is very difficult to achieve low enough threshold current and operating current which are required for the practical use.

SUMMARY OF THE INVENTION

In view of the above-mentioned problems in the related art, the object of the present invention is to sufficiently increase the reflectivity of a facet mirror and to realize a low threshold current and a low operating current even if a Si substrate is used for the epitaxial growth of a GaN-based semiconductor laser structure.

In order to achieve the above-mentioned object, the present invention includes an epitaxially grown GaN-based laser structure on a silicon (Si) substrate having a principal surface of a {100} plane to make a cleavage face of the substrate a {011} plane perpendicular to the {100} plane of the Si substrate and to make this {011} plane of the Si substrate to be parallel to a {1-100} plane of a cleavage facet of GaN, thereby fabricating a nitride semiconductor laser diode with high enough reflectivity at the mirror.

Here, in the description of this application, a negative sign "−" attached to an index expressing a plane orientation or a direction of a crystallographic axis expresses a reverse of an index following the sign "−" for the sake of convenience.

Specifically, the nitride semiconductor laser device in accordance with the present invention includes: a silicon substrate of which the principal surface is a {100} plane; and a plurality of group III nitride semiconductor layers formed on the Si substrate and including a cleaved facet parallel to a {011} plane of the Si substrate which composes a reflective mirror of a laser diode.

The nitride semiconductor laser diode in accordance with the present invention includes a silicon substrate of which principal surface is a {100} plane and a group III nitride semiconductor layers which has a cleaved facet parallel to a {011} plane of silicon. Since this cleavage facet has fairly good flatness serving high enough reflectivity, even though the nitride semiconductor laser diode is fabricated on an inexpensive silicon substrate, the nitride semiconductor laser diode can achieve a low threshold current and a low operating current.

In the nitride semiconductor laser diode of the present invention, it is preferable that principal surface of the nitride semiconductor laminate is a {0001} plane of the nitride.

With this configuration, the group-III nitride semiconductor can be cleaved perpendicular to the principal surface of the {0001} plane by the {011} plane of Si which is a cleavage facet of the {100} plane of Si. Thus, an excellent cleaved facet can be formed in the nitride semiconductor.

In the nitride semiconductor laser diode of the present invention, it is preferable that the cleaved facet of the nitride semiconductor is a {1-100} plane.

With this configuration, the {011} plane as a cleavage face of the {100} plane of Si and the {1-100} plane as a cleavage face of the {0001} plane of GaN can be formed so as to be parallel to each other. Thus, a flatter cleaved facet can be obtained.

It is preferable that the nitride semiconductor laser diode of the present invention further includes a thin film formed between the substrate and the nitride semiconductor, and made of silicon with a principle surface of a {111} plane and that the nitride semiconductor is epitaxially grown on a principal surface of the thin film.

With this configuration, the crystal quality of the nitride semiconductor can be further improved and hence excellent device performance including a low threshold current and a high slope efficiency can be achieved.

In this case, it is preferable that the nitride semiconductor laser diode of the present invention further includes an insulating film formed between the substrate and the thin film.

With this configuration, a substrate for the epitaxial growth is to be an SOI (silicon-on-insulator) substrate. In addition, the insulating film formed between the substrate and the thin film has a smaller refractive index than silicon, so that emitted light from the active layer in the nitride semiconductor can be easily confined in the nitride semiconductor layers.

In the nitride semiconductor laser diode of the present invention, the thin film may contain hydrogen ions.

With this configuration, when hydrogen ions are implanted onto a Si {111} substrate with a specified depth and the substrate is bonded to the Si{100} substrate or the insulating film on it and then is subjected to heat treatment, a region where the hydrogen ions are implanted is easily separated from the body of the Si{111} substrate. Hence, the thin film of Si{111} can be formed into a thin film having a desired film thickness.

In the nitride semiconductor laser diode of the present invention, it is preferable that the thin film is formed in such a way that a <1-10> direction of a crystallographic axis of the thin film coincides with a <011> direction of a crystallographic axis of the substrate.

With this configuration, the cleaved facet of the nitride semiconductor formed on the thin film is parallel to the cleaved facet of the substrate, so that a flatter cleaved facet can be formed on the nitride semiconductor.

In the nitride semiconductor laser diode of the present invention, it is preferable that at least a part of the thin film is substituted by silicon carbide.

With this configuration, since the lattice constant of silicon carbide (SiC) is relatively close to that of gallium nitride (GaN), a nitride semiconductor with better crystal quality can be formed on the thin film in which at least a portion is substituted by SiC. As a result, excellent device performance including a low threshold current and a high slope efficiency can be achieved.

In the nitride semiconductor laser diode of the present invention, it is preferable that the substrate has indented and projected portions on its principal surface and that the nitride semiconductor is epitaxially grown on the indented and projected portions.

With this configuration, when the indented and projected portions form plural facets each formed of the {111} plane of Si, the epitaxial growth takes place from the facets. For this reason, the crystal quality of the nitride semiconductor formed on the substrate can be improved. Thus, a blue-violet semiconductor laser diode having excellent device performance including a low threshold current and a high slope efficiency can be achieved.

Thus, it is preferable that each of the indented and projected portions is composed of a {111} plane of Si.

In the nitride semiconductor laser diode of the present invention, it is preferable that when the substrate has the indented and projected portions on its principal surface, the plane orientation of the principal surface of the semiconductor laminate is a {1-101} plane in gallium nitride.

With this configuration, the nitride semiconductor has a flat surface and can realize excellent crystal quality. In addition, polarization induced electric field is not formed perpendicularly to the principal surface of the {1-101} plane, and hence, the so-called quantum Stark effect does not appear, so that light emitting efficiency in the active layer can be improved. As a result, a blue-violet semiconductor laser diode having excellent device performance including a low threshold current and a high slope efficiency can be achieved.

In the nitride semiconductor laser diode of the present invention, in the case where the substrate has the indented and projected portions on its principal surface, it is preferable that a cleaved facet of the nitride semiconductor is a {1-100} plane.

With this configuration, the {011} plane which is a cleaved facet of the Si {100} and the {1-100} plane which is a cleaved face of the GaN {1-101} plane can be formed so as to be parallel to each other. Thus, a flatter cleaved facet can be realized.

In the nitride semiconductor laser diode of the present invention, it is preferable that the nitride semiconductor has a stripe-shaped waveguide which is placed perpendicularly to the cleaved facet and that the waveguide is formed so as to be located above one groove formed at the indented and projected portions.

With this configuration, the light emitting active portion of the laser diode is placed in the region with lower crystal defects where the nitride semiconductor is grown from plural facets of the groove by enhanced lateral growth, so that a blue-violet semiconductor laser diode having high reliability can be realized.

In the nitride semiconductor laser diode of the present invention, it is preferable that the nitride semiconductor is electrically conductive in a portion formed between the active layer and the substrate and that an electrode is formed on a plane of the substrate opposite to the surface of the nitride semiconductor.

With this configuration, the electrode is formed on the backside surface of the substrate, so that a chip area can be further reduced to reduce the cost further.

In the nitride semiconductor laser diode of the present invention, it is preferable that the nitride semiconductor has a periodic layer structure formed between the active layer and the substrate and formed of a first semiconductor layer and a second semiconductor layer which are different from each other in composition and in refractive index and are alternately stacked, the periodic layer structure being formed so as to increase the reflectivity of the light emitted from the active layer.

With this configuration, the periodic layer structure formed between the active layer and the substrate functions as a part of the cladding layer in the semiconductor laser diode, so that the total thickness of the cladding layer can be reduced. For this reason, the film thickness of the nitride semiconductor laminate formed on the substrate can be reduced, which in turn can prevent cracks in the nitride semiconductor. As a result, a blue-violet semiconductor laser diode with higher performance and higher reliability can be realized. Further, the time required for growing the crystal of the nitride semiconductor can be shortened. Hence, a blue-violet semiconductor laser diode can be manufactured at lower cost.

In this case, it is preferable that each of the first semiconductor layer and the second semiconductor layer has a thickness of one fourth of an optical wavelength corresponding to a wavelength of the emitted light.

With this configuration, the periodic layer structure composes a distributed Bragg reflector (DBR) mirror and can increase the reflectivity, which in turn can serve better optical confinement in the active layer. As a result, the threshold current can be further reduced.

In this case, it is preferable that the first semiconductor layer is made of aluminum nitride and that the second semiconductor layer is made of gallium nitride.

With this configuration, the reflectivity in the periodic layer structure can be increased and the stress caused by a lattice mismatch and a difference in thermal expansion between the substrate and the nitride semiconductor can be relaxed. With this, the cracks in the nitride semiconductor can be prevented, and hence, a blue-violet semiconductor laser diode with higher performance and higher reliability can be realized.

In the nitride semiconductor laser diode of the present invention, it is preferable that the nitride semiconductor has a stripe-shaped waveguide, which is formed between the active layer and the substrate, has a mask film having a plurality of apertures, and is epitaxially grown selectively from the respective apertures of the mask film, is formed so as to be located above a region except the apertures of the mask film and the direction of the waveguide is set to be perpendicular to the cleaved facet of the nitride semiconductor.

With this configuration, the nitride semiconductor is grown in a lateral direction on the mask film, so that a portion grown in the lateral direction on the mask film in the nitride semiconductor has less number of crystal defects. Hence, a blue-violet semiconductor laser diode with higher performance and higher reliability can be realized.

As described above, according to the nitride semiconductor laser diode in accordance with the present invention, the cleaved facet which is composed of the highly reflective facet mirror can be formed in the nitride semiconductor laminate and formed on the silicon substrate of which principal surface is the {100} plane. Thus, although the nitride semiconductor laser diode is manufactured on an inexpensive silicon substrate, the nitride semiconductor laser diode can realize a low threshold current and a low operating current. The cost of the blue-violet semiconductor laser can be reduced with the above high performance maintained.

BRIEF DESCRIPTION OF THE DRAWINGS

FIG. 1A and FIG. 1B show a nitride semiconductor laser diode according to a first embodiment of the present invention. FIG. 1A is a plan view and FIG. 1B is a cross sectional view along a line Ib-Ib in FIG. 1A.

FIG. 1C is schematic diagram showing the respective plane orientations and the directions of the respective cleaved faces of a substrate, a thin film, and a nitride semiconductor.

FIGS. 4A and 4B show a nitride semiconductor laser diode in accordance with a second embodiment of the present invention. FIG. 4A is a plan view and FIG. 4B is a cross sectional view along a line IVb-IVb in FIG. 4A.

FIG. 4C is schematic diagram showing the respective plane orientations and the directions of the respective cleaved faces of a substrate and a nitride semiconductor.

DESCRIPTION OF THE PREFERRED EMBODIMENTS

First Embodiment

Figure 2A:
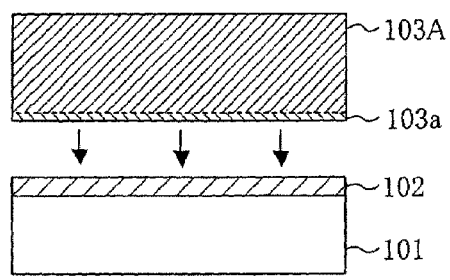
FIGS. 2A to 2F are cross sectional views, in the order of process, showing a method for manufacturing a nitride semiconductor laser diode according to the first embodiment of the present invention.

A first embodiment of the present invention will be described with reference to the drawings.

FIG. 1A and FIG. 1B show a nitride semiconductor laser diode according to the first embodiment of the present invention. FIG. 1A is a plan construction and FIG. 1B is a section construction along a line Ib-Ib in FIG. 1A.

As shown in FIG. 1A and FIG. 1B, the nitride semiconductor laser diode according to the first embodiment of the present invention includes: a so-called SOI (Silicon-On-Insulator) substrate including a substrate 101 made of silicon (Si) of which principal surface is a {100} plane; an insulating film 102 formed of silicon oxide ($SiO_2$) on the substrate 101 in a film thickness of about 100 nm, and a thin film 103 formed on the insulating film 102, having a film thickness of about 10 nm, and made of Si of which principal surface is a {111} plane; and a nitride semiconductor 120 including plural nitride semiconductor layers which are formed on the SOI substrate.

The nitride semiconductor 120 is constructed of the following layers formed subsequently on the SOI substrate, that is, on the thin film 103. The layers include: a periodic layer structure 104 formed of an initial layer made of aluminum nitride (AlN) and about twenty alternately stacked layers of first layers made of AlN and second layers made of gallium nitride (GaN); an n-type GaN layer 105; an n-type clad layer 106 made of n-type aluminum gallium nitride (AlGaN); a multiple quantum well (MQW) active layer 107 made of indium gallium nitride (InGaN); and a p-type clad layer 108 made of p-type AlGaN.

A stripe-shaped ridge (ridge stripe) part is formed at the top of the p-type cladding layer 108, and an ohmic p-side electrode 109 made of palladium (Pd)/platinum (Pt)/gold (Au) is formed on the stripe-shaped ridge part. Moreover, a blocking layer 110 made of silicon oxide ($SiO_2$) is formed on each side of the ridge part and in the region of each side thereof. Here, each of the ridge part and a region below the ridge part in the nitride semiconductor 120 functions as a waveguide of the semiconductor laser diode.

In one side portion of the ridge part in the nitride semiconductor 120, the p-type cladding layer 108, the MQW active layer 107, and the n-type cladding layer 106 are selectively removed, whereby the n-type GaN layer 105 is exposed. An ohmic n-side electrode 111 made of titan (Ti)/aluminum (Al)/nickel (Ni)/gold (Au) is formed on the exposed portion of this n-type GaN layer 105. The p-side electrode 109 and the n-side electrode 111 are covered with a pad electrode 112 made of Ti/Au. Here, it is preferable that an Au layer in the pad electrode 112 is formed by electro-plating.

As shown in FIG. 1A, the nitride semiconductor 120 is cleaved at a face 113 and has a resonance mirror (facet mirror) formed thereon. Further, a light emitting facet 113 is covered with a low-reflecting coating film 114, and a rear facet opposite to the light emitting facet is covered with a high-reflecting coating film 115 to thus compose a blue-violet semiconductor laser diode.

In FIG. 1C, the respective plane orientations of the substrate 101 and the thin film 103, which compose the SOI substrate, and the respective plane orientations of the nitride semiconductor 120, which is epitaxially grown on the thin film 103, are shown as the directions of crystal axes. As shown in FIG. 1C, in the first embodiment, the nitride semiconductor 120 is formed in such a way that a {1-100} plane of a cleaved facet thereof and a {011} plane of a cleaved facet of the substrate 101 are parallel to each other. In other words, the nitride semiconductor 120 is cleaved in such a way that the {1-100} plane of GaN parallel to the {011} plane of the substrate 101 becomes the cleaved facet 113, whereby a resonance mirror is formed. The positional relationship of these plane orientations can be obtained by making the <1-10> direction in the thin film 103, which is formed between the substrate 101 and the nitride semiconductor 120 and of which principal surface is a {111} plane, coincide with a direction perpendicular to the {011} plane of the cleaved facet of the substrate 101 (that is, the <011> direction of the crystallographic axis). Here, in the relationship between the plane orientation and the direction of the crystallographic axis, a direction normal to a crystal plane having a certain plane orientation becomes the direction of the crystallographic axis of the crystal plane.

With this construction, the following problem presented in the related art can be solved: that is, in the related art, in the case where the nitride semiconductor 120 having a laser structure is epitaxially grown on a Si substrate of which principal surface is a {111} plane, the cleaved facet 113 of the substrate is not made perpendicular to the {0001} plane of GaN but is slanted on Si {111}.

In the first embodiment, the {011} plane perpendicular to the {100} plane in the Si substrate 101 is the cleaved facet of the substrate 101, and this cleaved facet is arranged in parallel to a {1-100} plane, which is the cleaved facet 113 of the nitride semiconductor 120 and is perpendicular to the {0001} plane, whereby the flat cleaved facets 113 can be formed in a laser structure formed on the substrate 101.

In this regard, an n-type guiding layer and a p-type guiding layer, which are made of GaN and can provide more precise control of the optical confinement in the MQW active layer 107, may be formed respectively between the n-type cladding layer 106 and the MQW active layer 107 and between the p-type cladding layer 108 and the MQW active layer 107.

Moreover, an p-type AlGaN as an electron barrier layer, which has a comparatively high composition ratio of Al and can suppress the overflow of electrons to reduce a threshold current, may be formed between the p-type cladding layer 108 and the MQW active layer 107.

Further, in order to reduce a contact resistance in the p-side electrode 109, a p-type GaN as a contact layer may be formed between the p-type cladding layer 108 and the p-side electrode 109.

Furthermore, in the first embodiment, in order to relax stress in the nitride semiconductor 120 epitaxially grown on the thin film 103 made of Si, the number of periods of periodic layer structures 104 made of AlN/GaN is determined to be twenty. However, the thicknesses of the respective layers of the first layer made of AlN and the second layer made of GaN and the number of the periods layers need to be determined so as to obtain the best performance of the laser diode formed on the periodic structure 104. Here, as an example, it is preferable to employ a structure that the thickness of the first layer made of AlN is 5 nm and that the thickness of the second layer made of GaN is 20 nm.

Furthermore, the thicknesses of the first layer and the second layer may be respectively set to one fourth of an optical wavelength corresponding to 405 nm, which is the oscillating wavelength of the blue-violet semiconductor laser diode according to this embodiment, to increase a reflectivity in the periodic layer structure 104. This can improve optical confinement in the MQW active layer 107. Thus, in the case where the structure with high reflectivity of the periodic layer structure 104 is employed, the n-type GaN layer 105 between the n-type cladding layer 106 and the periodic layer structure 104 is not necessary to be placed. When the n-type GaN layer 105 is not placed in this manner, the film thickness of the nitride semiconductor 120 composing the laser structure can be reduced, which in turn can prevent cracks in the nitride semiconductor 120.

Furthermore, although AlN is used for the initial layer of the periodic layer structure 104, the initial layer is not necessarily made of AlN. For example, the initial layer may be silicon carbide (SiC) by a chemical vapor deposition (CVD) method and further may be a SiC film formed by carbonizing the thin film 103 made of Si by using a hydrocarbon gas. SiC has a lattice constant comparatively close to that of GaN and hence can form a laser structure having excellent crystal quality as is obtained on AlN.

In general, in order to improve the reliability of a semiconductor laser, crystal defects need to be reduced. For the purpose of further reducing the crystal defects, the crystal growth of the n-type GaN layer 105 is interrupted once, a mask film having an aperture parallel to the ridge part (waveguide) in the nitride semiconductor 120 and made of, for example, SiO$_2$ is formed, and then, the nitride semiconductor 120 following the n-type GaN layer 105 is epitaxially grown on the mask film. With this, the nitride semiconductor 120 is grown selectively in a lateral direction on the mask film made of a dielectric material, which can greatly reduce crystal defects. Thus, in the case where the ridge part is formed on a region grown in the lateral direction in the nitride semiconductor 120, the reliability of the semiconductor laser diode can be drastically improved.

As described above, in the first embodiment, the principal surface of the substrate 101 which has an effect on the plane orientation of the cleaved facet 113 of the nitride semiconductor 120 is the {100} plane, and the {011} plane perpendicular to the {100} plane is the cleaved facet of the substrate 101. Further, the {011} plane of the cleaved facet of the substrate 101 is arranged in parallel to the {1-100} plane, which is the cleaved facet 113 in the nitride semiconductor 120 having a {0001} plane as the plane orientation of its principal surface and is perpendicular to the {0001} plane, whereby the flatter cleaved facet 113 can be formed in the laser structure formed on the Si substrate 101.

In this manner, it is possible to realize the nitride semiconductor laser diode, which is made of an inexpensive and large-diameter Si substrate with flat cleaved facet as is conventionally obtained by the use of an expensive GaN substrate with a small wafer diameter. Thus, it is possible to reduce the cost of a nitride semiconductor laser diode emitting blue-violet light.

A method for manufacturing the nitride semiconductor laser diode fabricated in the above-mentioned manner will be described with reference to the drawings.

FIGS. 2A to 2F show the cross sectional structures, in the order of processing steps, of a method for manufacturing a nitride semiconductor laser diode in accordance with a first embodiment of the present invention.

First, as shown in FIG. 2A, the insulating film 102 made of SiO$_2$ and having a film thickness of about 100 nm is formed on the principal surface of the Si substrate 101, of which plane orientation is the {100} plane, by a thermal oxidation method, for example. A thin film forming Si substrate 103A of which principal surface is the {111} plane is prepared in addition to the formation of the insulating film 102, and hydrogen ions are implanted into a shallow region of a depth of about 10 nm or less from the principal surface of the prepared Si substrate 103A to form a hydrogen ion implanted region 103a in the Si substrate 103A. Subsequently, the insulating film 102 on the substrate 101 is bonded to the hydrogen ion implanted region 103a of the Si substrate 103A.

Figure 2D:
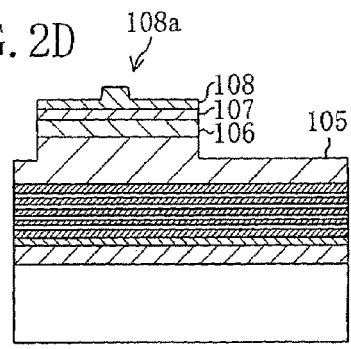
Figure 2B:
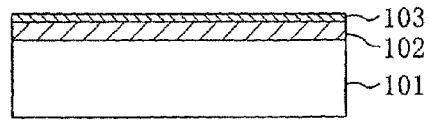

Next, as shown in FIG. 2B, the Si substrate 103A bonded to the insulating film 102 on the substrate 101 is subjected to high-temperature heat treatment, whereby only the hydrogen ion implanted region 103a of the Si substrate 103A can be selectively separated. In this manner, the thin film 103 made of Si of which principal surface is the {111} plane can be formed on the insulating film 102 of the substrate 101. This thin film forming method is referred to as the so-called smart cut method and can form the thin film 103 on the substrate 101, the thin film 103 having an extremely small thickness and being made of Si of which principal surface is the {111} plane, and the Si substrate 101 of which principal surface is the {100} plane. Here, as described above, the thin film 103 made of Si is bonded to the substrate 101 in such a way that the {011} plane of the cleaved facet of the substrate 101 is perpendicular to a <1-10> direction in the crystallographic axis of the thin film 103. As a result, in the case where the nitride semiconductor 120 is epitaxially grown on the thin film 103, the cleaved facet of the substrate 101 is made parallel to the {1-100} plane of the cleaved facet of GaN. In this manner, it is preferable that the film thickness of the thin film 103 made of Si is 10 nm or less. By thinning the thin film 103 in this manner as far as possible, the effect produced by the cleaved facet, which is produced in the thin film 103 and is cleaved in a direction slanted to the {100} plane of Si, can be minimized. For this reason, the flatter cleaved facet can be formed in the nitride semiconductor 120.

Figure 2E:
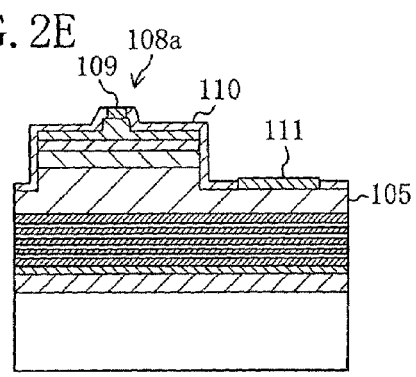
Figure 2C:
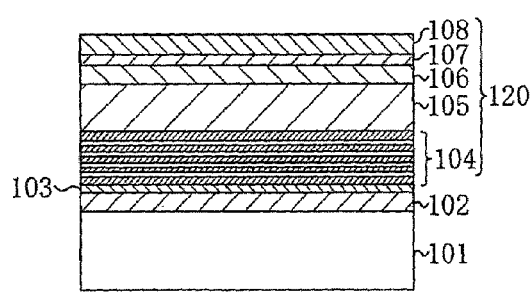

Next, as shown in FIG. 2C, the initial layer made of AlN, the periodic layer structure 104 made of about 20 periods of AlN/GaN, the n-type GaN layer 105, the n-type AlGaN cladding layer 106, the InGaN MQW active layer 107, and the p-type AlGaN cladding layer 108 are epitaxially grown subsequently on the thin film 103 by a metal organic chemical vapor deposition (MOCVD) method, whereby the nitride semiconductor 120 is formed. Here, the n-type nitride semiconductor layer is doped with Si as an n-type dopant by adding, for example, a silane (SiH$_4$) gas to reactant gases during the epitaxial growth. Moreover, the p-type semiconductor layer is doped with Mg as a p-type dopant by adding, for example, a cyclopentadienyl magnesium (Cp$_2$Mg) gas to reactant gases during the epitaxial growth. Blue-violet light with a wavelength of 405 nm is emitted from the MQW active layer 107 by passing current through the device. The periodic layer structure 104, as described above, is formed so as to reduce stress caused in the nitride semiconductor 120, and the thicknesses of the respective layers and the number of periods of the periodic layer structure 104 are optimized.

Next, as shown in FIG. 2D, a ridge part 108a, which extends in the shape of a stripe in a direction parallel to the <1-100> direction of the crystallographic axis in the nitride semiconductor 120, has a width of from 1 μm to 2 μm, and has a convex cross section, is formed at the top of the p-type cladding layer 108. The kink in the optical output characteristics of the semiconductor laser diode can be prevented by the optimization of the stripe width. Here, the stripe-shaped ridge part 108a can be formed by masking a ridge forming region at the top of the p-type cladding layer 108, for example, by the use of a resist pattern and by an inductively coupled plasma (ICP) etching method using a chlorine (Cl$_2$) gas. Subsequently, to form the n-side electrode, the side region of the ridge part 108a in the nitride semiconductor 120 is also etched by the same method to expose the n-type GaN layer 105 selectively.

Next, as shown in FIG. 2E, a blocking layer 110 made of SiO$_2$ and having a film thickness of 200 nm is formed on the nitride semiconductor 120, which has the ridge part 108a formed thereon and has the n-type GaN layer 105 exposed, by a CVD method using, for example, a SiH$_4$ gas and a O$_2$ gas as reactant gases. Subsequently, apertures are formed in the blocking layer 110 in an upper portion of the ridge part 108a and in the n-side electrode forming region of the n-type GaN layer 105. Subsequently, Pd/Pt/Au is deposited in the aperture formed in the upper portion of the ridge part 108a in the blocking layer 110 by an electron beam evaporation method and then the unnecessary portion of the deposited metal film and the resist pattern are removed together by using a lift-off method, thereby forming the p-side electrode 109. Moreover, the n-side electrode 111 is formed by depositing Ti/Al/Ni/Au in the aperture formed in the n-side electrode forming region in the blocking layer 110 by the electron beam evaporation method and then by using the lift-off method.

Figure 2F:
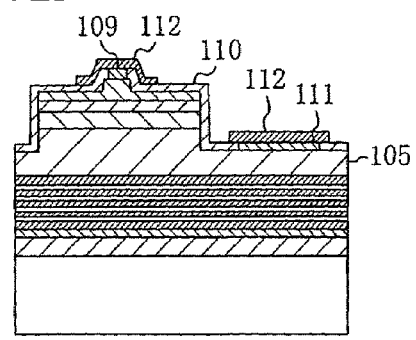

Next, as shown in FIG. 2F, the pad electrode 112 made of Ti/Au is formed so as to cover the p-side electrode 109 and the n-side electrode 111. Here, an Au layer in the pad electrode 112 preferably has a comparatively large thickness for wire bonding and is formed by electro-plating, for example.

As described above, according to the manufacturing method for a blue-violet semiconductor laser diode in accordance with the first embodiment, the principal surface of the substrate 101 is made the {100} plane, and the {011} plane perpendicular to the {100} plane is made the cleaved facet of the substrate 101. Further, the {011} plane of the cleaved facet of the substrate 101 is arranged so as to be parallel to the {1-100} plane, which is the cleaved face in the nitride semiconductor 120 having the {0001} plane as the principal surface and which is perpendicular to the {0001} plane, whereby the excellent cleaved facet can be formed in the laser structure formed on the Si substrate 101.

With this, the nitride semiconductor laser diode having the flat cleaved facet can be realized on the inexpensive large-area Si substrate. Hence, reduction in cost of the nitride semiconductor laser diode can be realized.

One Modification of the First Embodiment

Figure 3:
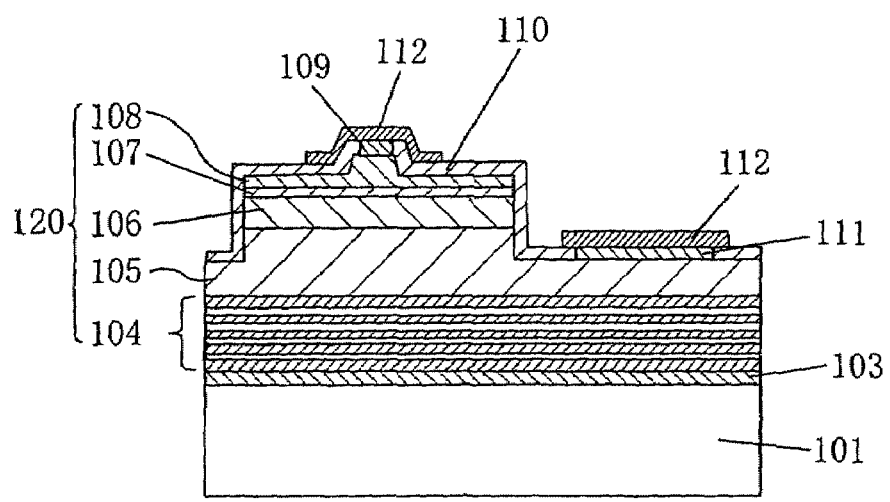
FIG. 3 is a sectional view showing a nitride semiconductor laser diode in accordance with a modification of the first embodiment of the present invention.

FIG. 3 shows the cross sectional structure of a nitride semiconductor laser diode in accordance with one modification of the first embodiment of the present invention. In FIG. 3, the same constituent parts as the constituent parts shown in FIG. 1B are denoted by the same reference symbols and their descriptions will be omitted.

As shown in FIG. 3, in the nitride semiconductor laser device in accordance with this modification, the thin film 103 made of Si of which principal surface is the {111} plane is formed directly on the principal surface of the Si substrate 101 of which principal surface is the {100} plane.

Here, similarly to the first embodiment, the thin film 103 can be formed by the smart cut method, for example.

According to this modification, a processing step for forming the insulating film 102 on the principal surface of the substrate 101 can be omitted In this regard, in the first embodiment, the insulating film 102 made of silicon oxide is formed between the substrate 101 and the thin film 103. However, in the case where the insulating film 102 is formed on the substrate 101, the better optical confinement for the light emitted from the MQW active layer 107 in the nitride semiconductor 120 can be obtained.

Second Embodiment

A second embodiment of the present invention will be described below with reference to the drawings.

FIGS. 4A and 4B show a nitride semiconductor laser diode in accordance with the second embodiment of the present invention. FIG. 4A shows a plan structure and FIG. 4B shows a cross sectional structure along a line IVb-IVb in FIG. 4A.

As shown in FIG. 4B, in the nitride semiconductor laser diode in accordance with the second embodiment, indented and projected portions 201a made of plural facets of {111} planes are formed on the principal surface of a n-type silicon substrate 201 of which plane orientation is a {100} plane, and a nitride semiconductor 220 is formed on the indented and projected portions 201a to form a blue-violet semiconductor laser diode.

Further, as shown in FIG. 4C, the {011} plane of the cleaved facet of the substrate 201 is formed so as to be parallel to the {1-100} plane of the cleaved facet of the nitride semiconductor 220.

Specifically, as shown in FIG. 4B, the indented and projected portions 201a made of facets of which plane orientation is a {111} plane are formed on the principal surface of the substrate 201, and an initial n-type AlN layer 202 and a first n-type GaN layer 203 are formed on the indented and projected portions 201a. Here, the principal surface of the nitride semiconductor 220 epitaxially grown from the facets of which plane orientation is the {111} plane becomes a {1-101} plane.

A stripe-shaped mask film 204 having plural apertures and made of SiO$_2$, for example, are formed in the first n-type GaN layer 203 of which top surface is grown into a flat shape. A second n-type GaN layer 205 is formed in the respective apertures of the mask film 204 by epitaxial growth. Here, the second n-type. GaN layer 205 has lateral growth portion on the mask film 204 and hence has less number of the crystal defects.

A periodic structure 206 made of n-type AlN/n-type GaN, a third n-type GaN layer 207, an n-type AlGaN cladding layer made 208, an InGaN multiple quantum well (MQW) active layer 209, and a p-type AlGaN cladding layer 210 are formed subsequently by epitaxial growth on the second n-type GaN layer 205 with less number of the crystal defects.

The principal surface of the MQW active layer 209 is also the {1-101} plane, and hence, a polarization induced electric field is not produced perpendicular to the principal surface, so that the MQW active layer 209 is not affected by the so-called quantum Stark effect. This can improve the light emission efficiency in the MQW active layer 209 and hence can reduce the threshold current of the semiconductor laser diode and can improve the slope efficiency.

A stripe-shaped ridge part is formed at the top of the p-type cladding layer 210, and an ohmic p-side electrode 211 made of Pd/Pt/Au is formed on the ridge part. Moreover, a blocking layer 212 made of SiO$_2$ is formed on each side of the ridge part and in each side region thereof. Here, the ridge part and a region below the ridge part in the nitride semiconductor 220 function as the waveguide of the semiconductor laser diode. The p-side electrode 211 is covered with a pad electrode 213 made of Ti/Au, and a Au layer is formed by electroplating. Moreover, an ohmic n-side electrode 214 made of AuSb/Au is formed as a backside electrode on a surface opposite to the nitride semiconductor 220 in the n-type Si substrate 201.

In this manner, in the nitride semiconductor laser diode in accordance with the second embodiment, the structure that silicon (Si) of which principal surface is the {100} plane is used for the substrate 201 is the same as the structure in the first embodiment. However, in place of forming the substrate 201 in an SOI structure, the nitride semiconductor 220 including a semiconductor laser structure is epitaxially grown directly on the indented and projected portions 201a made of plural facets each having the {111} plane. With this, the second embodiment is different from the first embodiment in that the principal surface of the nitride semiconductor 220 becomes the {1-101} plane and in that the conduction type of the lower portion of the MQW active layer 209 in the nitride semiconductor 220 including the n-type substrate 201 is made an n-type to form a structure in which current passes in a direction perpendicular to the substrate 201 to thus decrease the chip area of the laser diode.

Figure 5:
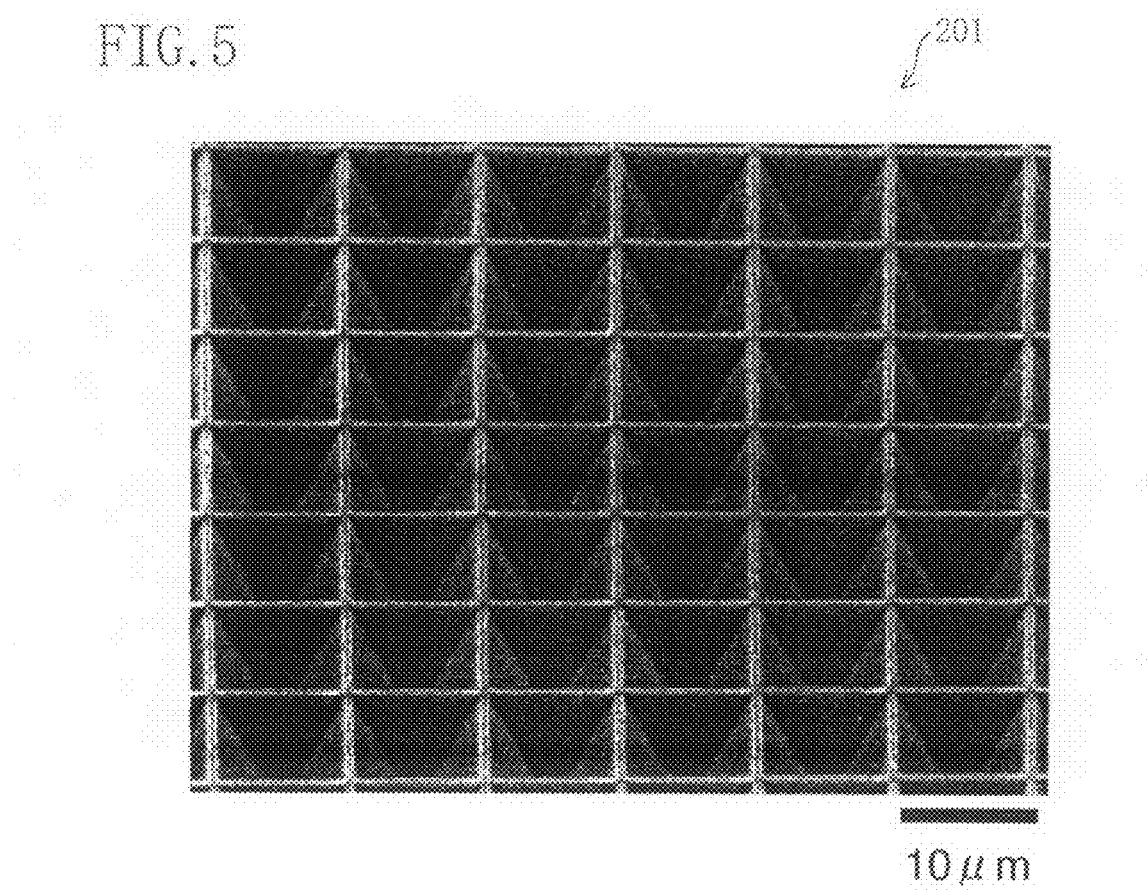
FIG. 5 is a photograph, taken by a scanning electron microscope (SEM), of indented and projected portions formed in the principal surface of the substrate in accordance with the second embodiment of the present invention.
Figure 6:
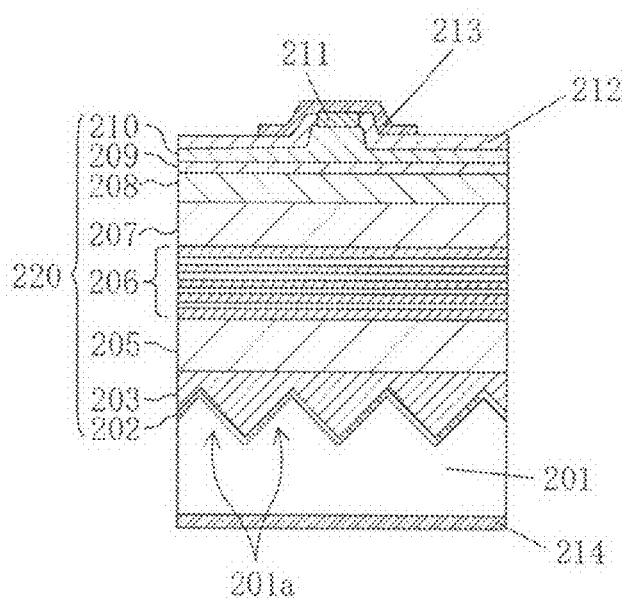
FIG. 6 is a cross sectional view showing a nitride semiconductor laser diode in accordance with a modification of the second embodiment of the present invention.

In this regard, the indented and projected portions 201a formed on the principal face of the substrate 201 may be formed in the shape of a stripe and, as shown by a photograph in FIG. 5, may be formed, for example, in a structure in which micro inverse pyramids are arranged in a matrix. The spacing of the indented and projected portions 201a may be, for example, 1 μm or less so as to realize good crystal quality. Further, as shown in FIG. 6, the spacing of the indented and projected portions 201a may be, for example, 10 μm or more so as to become larger than the width of the ridge part. Moreover, as shown in FIG. 6, a structure may be employed in which the spacing of the indented and projected portions 201a is, for example, 10 μm or more so as to become larger than the width of the ridge part and in which the mask film 204 is not formed. With this structure, a waveguide part of a semiconductor laser structure can be completely included in a region above one V-shaped groove. Thus, the density of crystal defects is reduced in the region above this one V-shaped groove, so that it is not necessary to use lateral growth by the mask film 204.

In addition, in the second embodiment has been shown a case in which the principal surface of the nitride semiconductor 220 is the {1-101} plane, but depending on the condition of the epitaxial growth, the {0001} plane of GaN can be also formed. Here, when the principal surface of the nitride semiconductor 220 is made a {0001} plane, the indented and projected portions 201a are not necessarily formed on the principal surface of the substrate 201. Moreover, even when the principal surface of the nitride semiconductor 220 is the {0001} plane, a {1-100} plane of a cleaved facet 215 becomes parallel to the cleaved facet of the substrate 201. The nitride semiconductor 220 is cleaved along the cleavage faces 215 arranged in this manner to form a resonance mirror. Further, of the cleavage faces 215, a light emitting facet is covered with a low-reflecting coating film 216, and a rear facet opposite to the light emitting facet is covered with a high-reflecting coating film 217. In this manner, a blue-violet semiconductor laser diode can be realized.

By the use of this structure, similarly to the first embodiment, the {011} plane perpendicular to the {100} plane in the n-type Si substrate 201 is made the cleaved facet of the substrate 201, and this cleaved facet is arranged parallel to the {1-100} plane, which is the cleaved facet 215 of the nitride semiconductor 220 and is perpendicular to the {1-101} plane, whereby the flat cleavage faces 215 can be formed in the laser structure formed on the substrate 201.

In this regard, in the nitride semiconductor 220 composing the semiconductor laser structure, similarly to the first embodiment, a p-type GaN or n-type GaN guiding layer which sandwiches the MQW active layer 209 in a vertical direction may be formed; an p-type AlGaN electron barrier layer having a comparatively high composition ratio of Al may be formed between the p-type cladding layer 210 and the MQW active layer 209; and a p-type GaN contact layer may be formed on the p-type cladding layer 210.

Further, the thicknesses and compositions of the respective layers composing the periodic structure 206 made of n-type AlN/n-type GaN may be designed appropriately to increase reflectivity in the periodic structure 206, and the third n-type GaN layer 207 under the n-type cladding layer 208 may not be formed.

Still further, while the n-type AlN is used for the initial layer 202, a silicon carbide (SiC) layer formed by the CVD method may be used, or a SiC layer formed by carbonizing a Si layer may be used.

Still further, in the nitride semiconductor laser diode in accordance with the second embodiment, the laser structure included in the semiconductor laminate 220 is grown in the lateral direction by the mask layer 204 made of SiO₂, and the ridge part (waveguide) is arranged on the region grown in the lateral direction. This can greatly improve the reliability of the blue-violet semiconductor laser diode.

As described above, according to the blue-violet semiconductor laser diode in accordance with the second embodiment, the substrate 201 of which plane orientation of the principal surface is the {100} plane is used, and the {011} plane perpendicular to the {100} plane is made the cleaved facet of the substrate 201. Further, the {011} plane of the cleaved facet of the substrate 201 is arranged in parallel to the {1-100} plane which is the cleaved facet 215 in the nitride semiconductor 220 having the {1-101} plane as the principal surface and which is perpendicular to the {1-101} plane. With this, the flat cleavage faces 215 can be formed in the laser structure formed on the Si substrate 201.

In this manner, the nitride semiconductor laser diode having the flat cleaved facet can be realized by the use of the inexpensive large-area Si substrate, so that a reduction in cost of the blue-violet semiconductor laser diode can be realized.

A method for manufacturing a nitride semiconductor laser device structured as above will be described with reference to the drawings.

FIGS. 7A to 7F show the sectional constructions, in the order of the processing steps, of the method for manufacturing a nitride semiconductor laser diode in accordance with the second embodiment of the present invention.

Figure 7A:
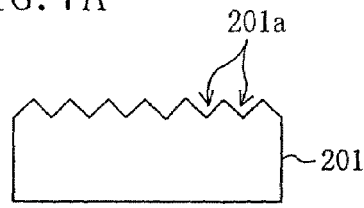
FIGS. 7A to 7F are sectional views, in the order of the process, showing a method for manufacturing a nitride semiconductor laser diode in accordance with the second embodiment of the present invention.

First, as shown in FIG. 7A, a mask pattern (not shown) having a stripe-shaped pattern or a lattice-shaped pattern is formed on the principal surface of the n-type Si substrate 201 of which orientation direction is the {100} plane, and the principal surface of the substrate 201 is wet etched by the use of the formed mask pattern and an alkaline solution, such as potassium hydroxide (KOH). The indented and projected portions 201a composed of only facets each having the plane orientation of the {111} plane are formed on the principal surface of the substrate 201 under selected suitable etching conditions in this point.

Figure 7D:
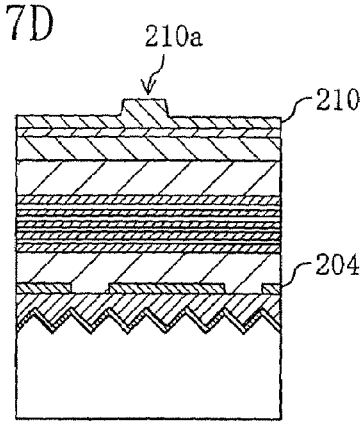
Figure 7B:
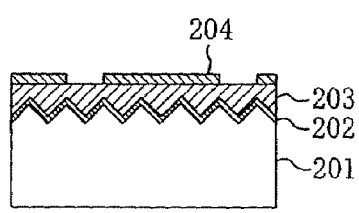

Next, as shown in FIG. 7B, the mask pattern is removed, and then, the initial layer 202 made of n-type AlN and the first n-type GaN layer 203 are epitaxially grown from the respective facet planes until its top surface becomes nearly flat by the MOCVD method. At this time, the principal surfaces of the epitaxially grown layer from the facet planes become the {1-101} plane. Subsequently, a SiO₂ film is formed on the first n-type GaN layer 203, for example, by the CVD method, and the formed SiO₂ film is selectively wet-etched to form a mask film 204 having a stripe shape from the SiO₂ film.

Figure 7E:
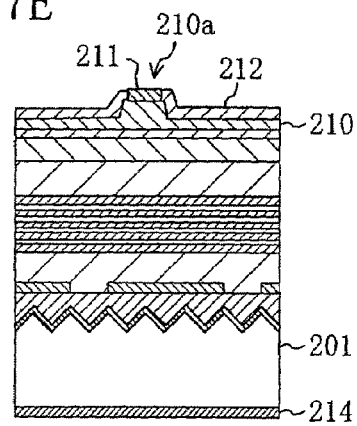
Figure 7C:
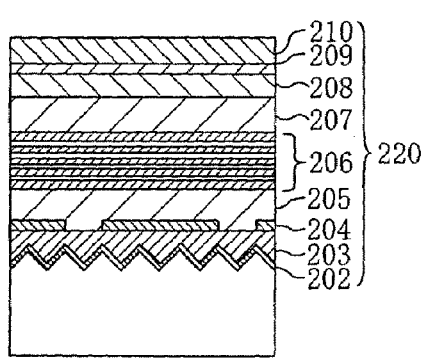

Next, as shown in FIG. 7C, the second n-type GaN layer 205, the periodic layer structure 206 made of n-type AlN/n-type GaN, the third n-type GaN layer 207, the n-type AlGaN cladding layer 208, the InGaN MQW active layer 209, and the p-type AlGaN clad layer 210 are again epitaxially grown subsequently on the first n-type GaN layer 203 through the respective apertures of the mask film 204 by the MOCVD method. In the second embodiment, the lateral growth on the mask film 204 is accelerated, so that the crystal defects in the second n-type GaN layer 205 and in the respective semiconductor layers grown on the second n-type GaN layer 205 are reduced by a large amount. As described above, the principal surface of the MQW active layer 209 becomes the {1-101} plane, so that a polarization induced electric field perpendicular to the MQW active layer 209 is not formed. For this reason, the MQW active layer 209 resists being affected by the so-called quantum Stark effect, and hence, the light emission efficiency in the MQW active layer 209 can be improved. Moreover, similarly to the first embodiment, the n-type semiconductor layer is doped with Si, and the p-type semiconductor layer is doped with Mg. In the second embodiment, when current is passed through the MQW active layer 209, the MQW active layer 209 emits blue-violet light with a wavelength of 405 nm.

Next, as shown in FIG. 7D, a ridge part 210a, which extends in the shape of a stripe in a direction parallel to the <1-100> direction of the crystallographic axis in the nitride semiconductor 220, has a width of from 1 μm to 2 μm, and has a convex cross section, is formed at the top of the p-type cladding layer 210 by the ICP etching using a $Cl_2$ gas, for example. At this time, the ridge part 210a can be located in a region above the mask film 204 where crystal quality is better in a region which is above the mask film 204 and is not directly above the central portion of the mask film 204.

Next, as shown in FIG. 7E, a block layer 212 made of $SiO_2$ and having a film thickness of 200 nm is formed on the p-type cladding layer 210 having the ridge part 210a formed by the CVD method, for example. Subsequently, an aperture is formed in the blocking layer 212 at a portion above the upper portion of the ridge part 210a. Subsequently, the p-side electrode 211 is formed by depositing Pd/Pt/Au in the aperture formed in the upper portion of the ridge part 210a in the blocking layer 212 by the electron beam evaporation method and then by the use of the lift-off method. Then, AuSb/Au is deposited on the backside surface of the substrate 201 by the electron beam evaporation method to form the n-side electrode 214.

Figure 7F:
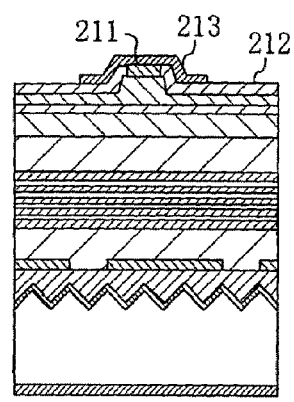

Next, as shown in FIG. 7F, a pad electrode 213 made of Ti/Au is formed so as to cover the p-side electrode 211. Here, an Au layer in the pad electrode 213 preferably has a comparatively large thickness for wire bonding and is formed by electroplating, for example.

As described above, according to the method for manufacturing a blue-violet semiconductor laser device in accordance with the second embodiment, the substrate 201 of which the principal surface is the {100} plane is used, and the {011} plane perpendicular to the {100} plane is made the cleaved facet of the substrate 201. Further, the facets each having the plane orientation of the {111} plane are formed on the principal surface of the substrate 201. With this, the plane orientation of the principal surface of the nitride semiconductor 220 grown on the facets is made the {1-101} plane, and the cleaved facet in the nitride semiconductor 220 is made the {1-100} plane and is made parallel to the {011} plane which is the cleaved facet of the substrate 201. As a result, the flat cleaved facet can be formed in the laser structure formed on the Si substrate 201.

With this, the nitride semiconductor laser diode can be realized on an inexpensive large-area Si substrate, so that reduction in cost of the nitride semiconductor laser diode can be realized.

In this regard, the nitride semiconductor used in the first embodiment, the second embodiment, or the modifications, a semiconductor laser diode can be made of any kind of semiconductor only if the nitride semiconductor with a hexagonal crystal structure is formed on a substrate of which principal surface is a {100} plane.

Further, as for the substrate, as far as a nitride semiconductor is formed on the principal surface of a substrate, which belongs a cubic system and of which the principal surface is a {100} plane, with the thin film of which the principal surface is a {111} plane or the indented and projected portions of facets in which the plane orientation of an exposed plane is a {111} plane interposed, the substrate made of gallium arsenide (GaAs) or indium phosphide (InP) can be used.

As far as excellent crystal growth can be realized, a substrate and a semiconductor laminate may have an offset angle with respect to the principal surface.

Further, a method for growing a nitride semiconductor layer is not limited to the MOCVD method but a nitride semiconductor layer may be formed so as to include at least one layer of semiconductor layer formed by, for example, a molecular beam epitaxy (MBE) method or a hydride vapor phase epitaxy (HVPE) method.

As described above, in the nitride semiconductor laser device in accordance with the present invention, a cleaved facet to make a flat facet mirror can be produced in the nitride semiconductor, so that even when an inexpensive silicon substrate is used, and a low threshold current and a low operating current can be realized. Thus, the nitride semiconductor laser diode in accordance with the present invention is useful for a blue-violet semiconductor laser diode and the like applicable to a light source for writing and reading a next-generation high-density optical disk.

What is claimed is:

1. A nitride semiconductor laser device comprising:
a substrate made of silicon in which a plane orientation of a principal surface is a {100} plane;
a semiconductor laminate that includes a plurality of semiconductor layers including an active layer formed on the principal plane of the substrate, each of the plurality of semiconductor layers being made of group III-V nitride;
a thin film formed between the substrate and the semiconductor laminate and made of silicon in which a plane orientation of a principal surface is a {111} plane, wherein:
the semiconductor laminate has a cleaved facet which forms a facet mirror of the nitride semiconductor diode,
the cleaved facet is parallel to a {001} plane which is a plane orientation of the silicon substrate,
a plane orientation of a principal surface of the semiconductor laminate is a {0001} plane in gallium nitride, and
the semiconductor laminate is epitaxially grown on a principal surface of the thin film.

2. The nitride semiconductor laser device according to claim 1,
wherein the semiconductor laminate has electrical conductivity in a portion formed between the active layer and the substrate, and
wherein an electrode is formed on a plane opposite to the semiconductor laminate in the substrate.

3. The nitride semiconductor laser device according to claim 1,
wherein the cleavage face of the semiconductor laminate is a {1-100} plane.

4. The nitride semiconductor laser device according to claim 1,
further comprising an insulating film formed between the substrate and the thin film.

5. The nitride semiconductor laser device according to claim 1,
wherein the thin film contains a hydrogen ion.

6. The nitride semiconductor laser device according to claim 1,
wherein the thin film is formed in such a way that a <1-10> direction of a crystallographic axis of the thin film coincides with a <011> direction of a crystallographic axis of the substrate.

7. The nitride semiconductor laser device according to claim 1,
wherein at least a part of the thin film is substituted by silicon carbide.

8. The nitride semiconductor laser device according to claim 1,
wherein the substrate has indented and projected portions on its principal surface, and
wherein the semiconductor laminate is epitaxially grown on the indented and projected portions.

9. The nitride semiconductor laser device according to claim 8,
wherein a plane orientation of a principal surface of the semiconductor laminate is a {1-101} plane in gallium nitride.

10. The nitride semiconductor laser device according to claim 8,
wherein a cleavage face of the semiconductor laminate is a {1-100} plane.

11. The nitride semiconductor laser device according to claim 8,
wherein the semiconductor laminate has a stripe-shaped waveguide structure extended perpendicularly to the cleavage face, the waveguide structure being formed so as to be located above one indented portion of the indented and projected portions.

12. The nitride semiconductor laser device according to claim 8,
wherein the semiconductor laminate has electric conductivity in a portion formed between the active layer and the substrate, and
wherein an electrode is formed on a plane opposite to the semiconductor laminate in the substrate.

13. The nitride semiconductor laser device according to claim 8,
wherein each of the indented and projected portions is constructed of a {111} plane which plane orientation of silicon.

14. The nitride semiconductor laser device according to claim 1,
wherein the semiconductor laminate has a periodic structure formed between the active layer and the substrate and formed of a first semiconductor layer and a second semiconductor layer which are different from each other in a composition and in a refractive index and are alternately laminated, the periodic structure being constructed so as to increase reflectivity of emitted light emitted from the active layer.

15. The nitride semiconductor laser device according to claim 14,
wherein each of the first semiconductor layer and the second semiconductor layer has a thickness of one fourth of an optical wavelength corresponding to a wavelength of the emitted light.

16. The nitride semiconductor laser device according to claim 14,
wherein the first semiconductor layer is made of aluminum nitride; and
wherein the second semiconductor layer is made of gallium nitride.

17. The nitride semiconductor laser device according to claim 1,
wherein the semiconductor laminate has a stripe-shaped waveguide structure, which is formed between the active layer and the substrate and has a mask film having a plurality of apertures and is epitaxially grown selectively from the respective apertures of the mask film and is extended perpendicularly to the cleavage face, the waveguide structure being formed so as to be located above a region except for the apertures of the mask film.

* * * * *